(12) United States Patent
Kim et al.

(10) Patent No.: US 10,609,829 B2
(45) Date of Patent: Mar. 31, 2020

(54) DISPLAY DEVICE

(71) Applicant: Samsung Display Co., Ltd., Yongin-si, Gyeonggi-do (KR)

(72) Inventors: Min Sang Kim, Yongin-si (KR); Seung Wook Kwon, Yongin-si (KR); Oh June Kwon, Yongin-si (KR); Hyo Jeong Kwon, Yongin-si (KR); Doo Hwan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 44 days.

(21) Appl. No.: 15/870,670

(22) Filed: Jan. 12, 2018

(65) Prior Publication Data

US 2018/0343753 A1 Nov. 29, 2018

(30) Foreign Application Priority Data

May 24, 2017 (KR) .................. 10-2017-0064020

(51) Int. Cl.

| H05K 1/02 | (2006.01) |
|---|---|
| H05K 5/00 | (2006.01) |
| G09F 13/04 | (2006.01) |
| H05K 1/03 | (2006.01) |
| H01L 27/32 | (2006.01) |
| H01L 51/52 | (2006.01) |

(52) U.S. Cl.
CPC ........... *H05K 5/0017* (2013.01); *G09F 13/04* (2013.01); *H01L 27/3258* (2013.01); *H01L 27/3276* (2013.01); *H05K 1/028* (2013.01); *H05K 1/0281* (2013.01); *H05K 1/0313* (2013.01); *G09F 2013/0418* (2013.01); *H01L 51/5253* (2013.01); *H05K 2201/0179* (2013.01); *H05K 2201/10128* (2013.01)

(58) Field of Classification Search
CPC . H01L 27/3258; H01L 27/3276; H05K 1/028; H05K 1/0281; H05K 2201/0179; G09F 2013/0418

See application file for complete search history.

(56) References Cited

U.S. PATENT DOCUMENTS

| 9,276,055 B1* | 3/2016 | Son ..................... H01L 27/3276 |
|---|---|---|
| 2005/0116617 A1* | 6/2005 | Lee ..................... H01L 27/3244 313/500 |
| 2007/0085961 A1* | 4/2007 | Jeong .................. H01L 27/3276 349/149 |
| 2014/0209360 A1* | 7/2014 | Peng ..................... H05K 1/028 174/254 |

(Continued)

FOREIGN PATENT DOCUMENTS

| KR | 10-2014-0103025 A | 8/2014 |
|---|---|---|
| KR | 10-2016-0141357 A | 12/2016 |

*Primary Examiner* — Donald L Raleigh
(74) *Attorney, Agent, or Firm* — Lewis Roca Rothgerber Christie LLP

(57) ABSTRACT

A display device includes: a substrate including a display region and a bent region provided at a side of the display region; a first insulating layer provided on the bent region of the substrate; a second insulating layer provided on the first insulating layer, the second insulating layer including at least one opening; and a third insulating layer provided on the second insulating layer and the at least one opening, and a pixel unit to display an image is provided on the display region of the substrate.

16 Claims, 7 Drawing Sheets

(56) References Cited

U.S. PATENT DOCUMENTS

| | | | |
|---|---|---|---|
| 2014/0232956 A1 | 8/2014 | Kwon et al. | |
| 2015/0380680 A1* | 12/2015 | Sakuishi | H01L 51/56 257/99 |
| 2016/0349878 A1* | 12/2016 | Kim | G02F 1/133305 |
| 2017/0092230 A1* | 3/2017 | Kuwabara | G06F 3/1423 |
| 2017/0223816 A1* | 8/2017 | Hirasawa | H05K 3/328 |
| 2018/0102399 A1* | 4/2018 | Cho | H01L 27/3258 |

\* cited by examiner

DISPLAY DEVICE

CROSS-REFERENCE TO RELATED APPLICATION

This application claims priority to and the benefit of Korean Patent Application No. 10-2017-0064020, filed on May 24, 2017 in the Korean Intellectual Property Office, the entire disclosure of which is incorporated by reference herein.

BACKGROUND

1. Field

Aspects of embodiments of the present disclosure relate to a display device including a bent region which is bendable.

2. Description of the Related Art

Recently, flexible display devices using flat panel display devices have been developed. The flat panel display devices generally include any of a liquid crystal display (LCD), an organic light emitting display device (OLED), an electro-phoretic display device (EPD), and the like.

Since the flexible display devices have bending and folding characteristics, the flexible display devices can be folded or rolled. Accordingly, the flexible display devices can be conveniently carried while implementing large screens. The flexible display devices can be applied in various fields including, not only mobile equipment such as mobile phones, portable multimedia players (PMPs), navigation devices, ultra-mobile PCs (UMPCs), electronic books, and electronic newspapers, but also TVs, monitors, and the like.

SUMMARY

According to an aspect of embodiments, a display device is stable without separation of a component, even in a state in which the display device is bent.

According to an aspect of one or more embodiments of the present disclosure, a display device includes: a substrate including a display region and a bent region provided at a side of the display region; a first insulating layer provided on the bent region of the substrate; a second insulating layer provided on the first insulating layer, the second insulating layer including at least one opening; and a third insulating layer provided on the second insulating layer and the at least one opening, wherein a pixel unit to display an image is provided on the display region of the substrate.

The opening may be provided as a plurality of openings.

The second insulating layer may include a plurality of sub-insulating layers.

Sub-insulating layers of the plurality of sub-insulating layers may include openings having diameters different from one another.

As each of the plurality of sub-insulating layers is closer to the first insulating layer, the sub-insulating layer may include an opening having a larger diameter.

A diameter of an opening of the plurality of openings that is located at an inner region of the bent region may be larger than a diameter of an opening of the plurality of openings that is located at an edge region of the bent region.

The first insulating layer may include a plurality of organic layers.

A depth of the at least one opening may be smaller than a thickness of the third insulating layer.

The bent region of the substrate may be foldable to have a radius of curvature of 5 mm or less.

A diameter of the at least one opening may be 0.5 μm to 2 μm.

The display device may include a plurality of lines in the bent region. The at least one opening may be provided between the plurality of lines.

The at least one opening may include openings provided in the form of a plurality of rows.

A thickness of the second insulating layer may be 5 μm to 10 μm.

A distance from an upper surface of the second insulating layer to an upper surface of the third insulating layer may be 30 μm to 150 μm.

The pixel unit may include a first electrode, an emitting layer, and a second electrode, which are sequentially stacked. The second electrode may be provided on the second insulating layer provided on the display region.

The display device may further include an encapsulation layer provided over the second electrode. The encapsulation layer may be provided on the display region, and may not cover the bent region.

The first insulating layer and the third insulating layer may be in contact with each other in the at least one opening.

BRIEF DESCRIPTION OF THE DRAWINGS

Some example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It is to be understood that when an element is referred to as being "between" two elements, it can be the only element between the two elements, or one or more intervening elements may also be present. Like reference numerals refer to like elements throughout.

DETAILED DESCRIPTION

Figure 1:
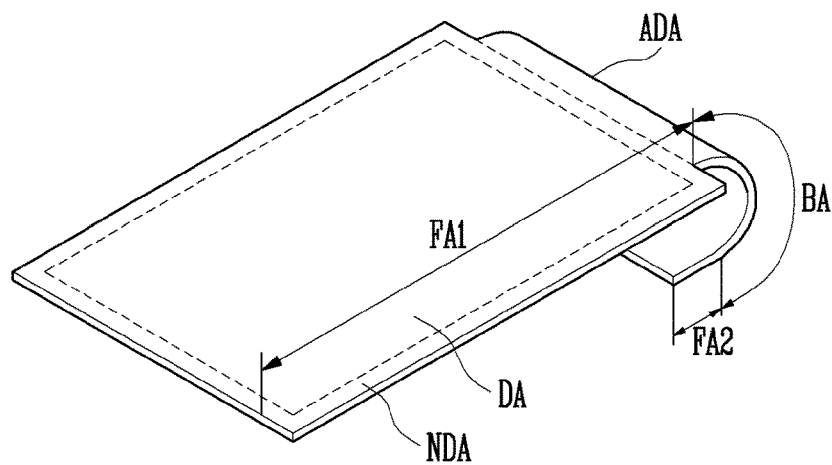
FIG. 1 is a perspective view illustrating a display device according to an embodiment of the present disclosure.

The present disclosure may apply various changes and different shapes, and, therefore, only some particular examples are illustrated herein. However, the examples do not limit the present disclosure but apply to all the changes and equivalent materials and variations. The drawings may be illustrated in an exaggerated manner for clarity of understanding.

Like numbers refer to like elements throughout. In the drawings, the thicknesses of certain lines, layers, components, elements, or features may be exaggerated for clarity. It will be understood that, although the terms "first," "second," etc. may be used herein to describe various elements, these elements should not be limited by these terms. These terms are merely used to distinguish one element from another element. Thus, a "first" element discussed below could also be termed a "second" element without departing from the teachings of the present disclosure. As used herein, singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate, or plate is placed "on" or "above" another element indicates not only a case in which the element is placed directly on or just above the other element but also a case in which one or more further elements are interposed between the element and the other element. Also, an expression that an element such as a layer, region, substrate, or plate is placed "beneath" or "below" another element indicates not only a case in which the element is placed directly beneath or just below the other element but also a case in which one or more further elements are interposed between the element and the other element.

In the disclosure, relative terms, such as "top surface" and "bottom surface" are used as relative concepts to facilitate the understanding of the inventive concept. Therefore, "top surface" and "bottom surface" do not designate a specific direction, position, or component, and may be interchangeable. For example, a "top surface" may be interpreted as a bottom surface, and a "bottom surface" may be interpreted as a top surface. Therefore, "top surface" may be represented as "first surface" and "bottom surface" may be represented as "second surface," while "top surface" may be represented as "second surface" and "bottom surface" may be represented as "first surface." However, "top surface" and "bottom surface" are not mixed with each other in one embodiment.

Figure 2:
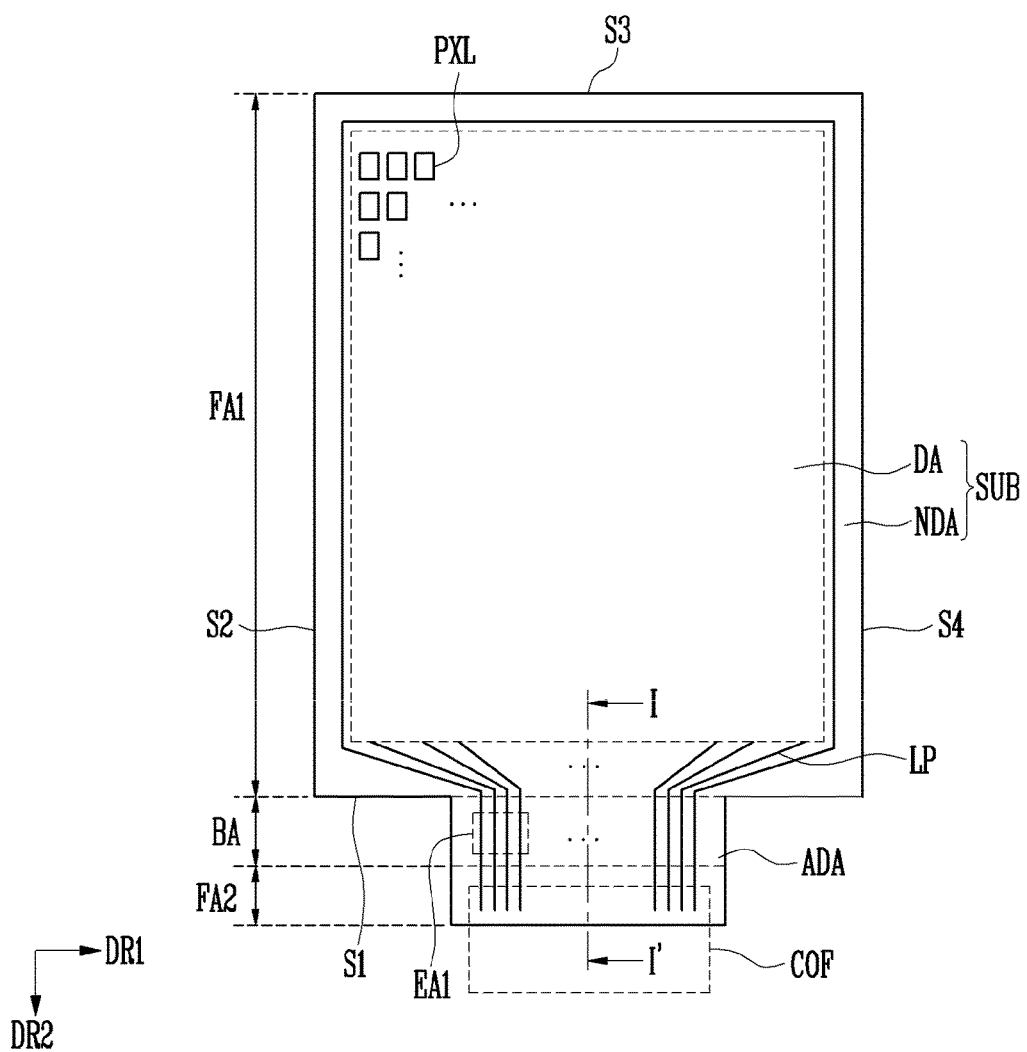
FIG. 2 is a plan view illustrating the display device of FIG. 1.

FIG. 1 is a perspective view illustrating a display device according to an embodiment of the present disclosure. FIG. 2 is a plan view illustrating the display device of FIG. 1.

Referring to FIGS. 1 and 2, a display device according to an embodiment of the present disclosure may include a substrate SUB, a pixel unit PXL provided on the substrate SUB, and a line unit including lines LP connected to the pixel unit PXL.

The substrate SUB includes a display region DA and a non-display region NDA provided at at least one side of the display region DA.

The substrate SUB may have an approximately quadrangular shape and, in an embodiment, a rectangular shape. In an embodiment of the present disclosure, the substrate SUB may include a pair of short sides parallel to each other in a first direction DR1 and a pair of long sides parallel to each other in a second direction DR2. In this embodiment, for convenience of description, the four sides of the substrate SUB, which are sequentially connected from one short side, are designated as first to fourth sides S1 to S4.

However, the shape of the substrate SUB is not limited thereto, and the substrate SUB may have any of various shapes. For example, the substrate SUB may be provided in any of various shapes, such as a closed polygon including linear sides, a circle, an ellipse, etc., including curved sides, and a semicircle, a semi-ellipse, etc., including linear and curved sides. In an embodiment of the present disclosure, when the substrate SUB has linear sides, at least one portion of corners of each of the shapes may be formed in a curve. For example, when the substrate SUB has a rectangular shape, a portion at which adjacent linear sides meet each other may be replaced with a curve having a curvature (e.g., a predetermined curvature). That is, a vertex portion of the rectangular shape may be formed with a curved side having both adjacent ends respectively connected to two adjacent linear sides, the curved side having a curvature (e.g., a predetermined curvature). The curvature may be differently set depending on a position. For example, the curvature may be varied depending on a position at which the curve is started, a length of the curve, etc.

The display region DA may be a region in which a plurality of pixel units PXL is provided to display an image. The display region DA may be provided in a shape corresponding to that of the substrate SUB. For example, like the shape of the substrate SUB, the display region DA may be provided in any of various shapes, such as a closed polygon including linear sides, a circle, an ellipse, etc., including curved sides, and a semicircle, a semi-ellipse, etc., including linear and curved sides. In an embodiment of the present disclosure, when the display region DA has linear sides, at least a portion of corners of each of the shapes may be formed in a curve.

The pixel unit PXL is provided on the display region DA of the substrate SUB. The pixel unit PXL is a minimum unit for displaying an image, and may be provided in a plurality. The pixel unit PXL may emit white light and/or colored light. Each pixel unit PXL may emit light of one of red, green, and blue. However, the present disclosure is not limited thereto, and each pixel unit PXL may emit light of a color such as cyan, magenta, or yellow.

The pixel unit PXL may be a light emitting device including an organic emitting layer. However, the present disclosure is not limited thereto, and the pixel unit PXL may be implemented in any of various forms, such as a liquid crystal device, an electrophoretic device, or an electrowetting device.

The pixel unit PXL may be provided in a plurality to be arranged in a matrix form along rows extending in the first direction DR1 and columns extending in the second direction DR2. However, the arrangement form of the pixel units PXL is not particularly limited, and the pixel units PXL may be arranged in any of various forms. For example, the pixel units PXL may be arranged such that one direction becomes the row direction or such that a direction oblique to the one direction becomes the row direction.

The non-display region NDA is a region in which the pixel unit PXL is not provided, and may be a region in which any image is not displayed.

The lines LP connected to the pixel unit PXL and a driving unit (not shown) connected to the lines LP to drive the pixel unit PXL may be provided in the non-display region NDA.

The lines LP may be connected to the pixel unit PXL. The lines LP may provide signals to each pixel unit PXL. The line LP may be one of a scan line, a data line, a first power line, and a second power line.

The lines LP may be provided throughout the display region DA and the non-display region NDA.

The lines LP may be connected to the driving unit (not shown). The driving unit provides signals to each pixel unit PXL through the lines LP, and, accordingly, the driving of each pixel unit PXL can be controlled.

The driving unit may include a scan driver (not shown) that provides a scan signal to each pixel unit PXL along the scan line, a data driver (not shown) that provides a data signal to each pixel unit PXL along the data line, and a timing controller (not shown) that controls the scan driver and the data driver.

In an embodiment of the present disclosure, the scan driver may be directly mounted on the substrate SUB. When the scan driver is directly mounted on the substrate SUB, the scan driver may be formed together with the pixel unit PXL in a process of forming the pixel unit PXL. However, the mounting position and forming method of the scan driver are not limited thereto, and the scan driver may be formed on a separate chip to be provided in a chip-on-glass form on the substrate SUB. Alternatively, the scan driver may be mounted on a printed circuit board to be connected to the substrate SUB through a connecting member.

In an embodiment of the present disclosure, the data driver may be directly mounted on the substrate SUB. However, the present disclosure is not limited thereto, and the data driver may be formed on a separate chip to be connected to the substrate SUB. In an embodiment of the present disclosure, when the data driver is formed on a separate chip to be connected to the substrate SUB, the data driver may be provided in the form of a chip-on-glass or a chip-on-plastic. Alternatively, the data driver may be mounted on a printed circuit board to be connected to the substrate SUB through a connecting member. In an embodiment of the present disclosure, the data driver may be provided in the form of a chip-on-film (COF) to be connected to the substrate SUB.

In an embodiment of the present disclosure, the non-display region NDA may further include an additional region ADA that protrudes from a portion thereof. The additional region ADA may protrude from one or more sides constituting the non-display region NDA. In an embodiment of the present disclosure, a case in which the additional region ADA protrudes from a side corresponding to one of the short sides of the substrate SUB is illustrated as an example. However, the additional region ADA may protrude from one of the long sides of the substrate SUB, or be provided in a shape protruding from two sides among the four sides of the substrate SUB. In an embodiment of the present disclosure, a data driver may be provided or connected to the additional region ADA. However, the present disclosure is not limited thereto, and any of various components may be disposed in the additional region ADA.

In an embodiment of the present disclosure, at least a portion of the display device of the present disclosure may have flexibility, and the display device may be folded at the portion having flexibility. That is, the display device may include a bent region BA that has flexibility and is bent in a direction, and a flat region that is provided at a side of the bent region BA and is flat without being folded. The flat region may have flexibility or may not have flexibility.

In an embodiment of the present disclosure, a case in which the bent region BA is provided in the additional region ADA is illustrated as an example. According to an embodiment of the present disclosure, a first flat region FA1 and a second flat region FA2 may be provided, which are spaced apart from each other with the bent region BA interposed therebetween, and the first flat region FA1 may include the display region DA. In an embodiment of the present disclosure, the bent region BA may be spaced apart from the display region DA.

In the bent region BA, when a line along which the display device is folded is referred to as a folding line, the folding line is provided in the bent region BA. Here, the term "folded" does not mean a fixed shape but means a shape deformable into another shape from the original shape, and includes a shape folded, curved, or rolled like a roll along one or more lines, i.e. one or more folding lines. Therefore, in an embodiment of the present disclosure, a state in which the display device is folded such that surfaces of the two flat regions FA1 and FA2 are located in parallel to each other and are folded to face each other is illustrated. However, the present disclosure is not limited thereto, and the display device may be folded such that surfaces of the two flat regions FA1 and FA2 form an angle (e.g., a predetermined angle) (e.g., an acute angle, a right angle, or an obtuse angle) with the bent region BA interposed therebetween.

In an embodiment of the present disclosure, the additional region ADA may be bent along the folding line in a subsequent process. In this case, as the additional region ADA is bent, a width of a bezel can be decreased.

Figure 3:
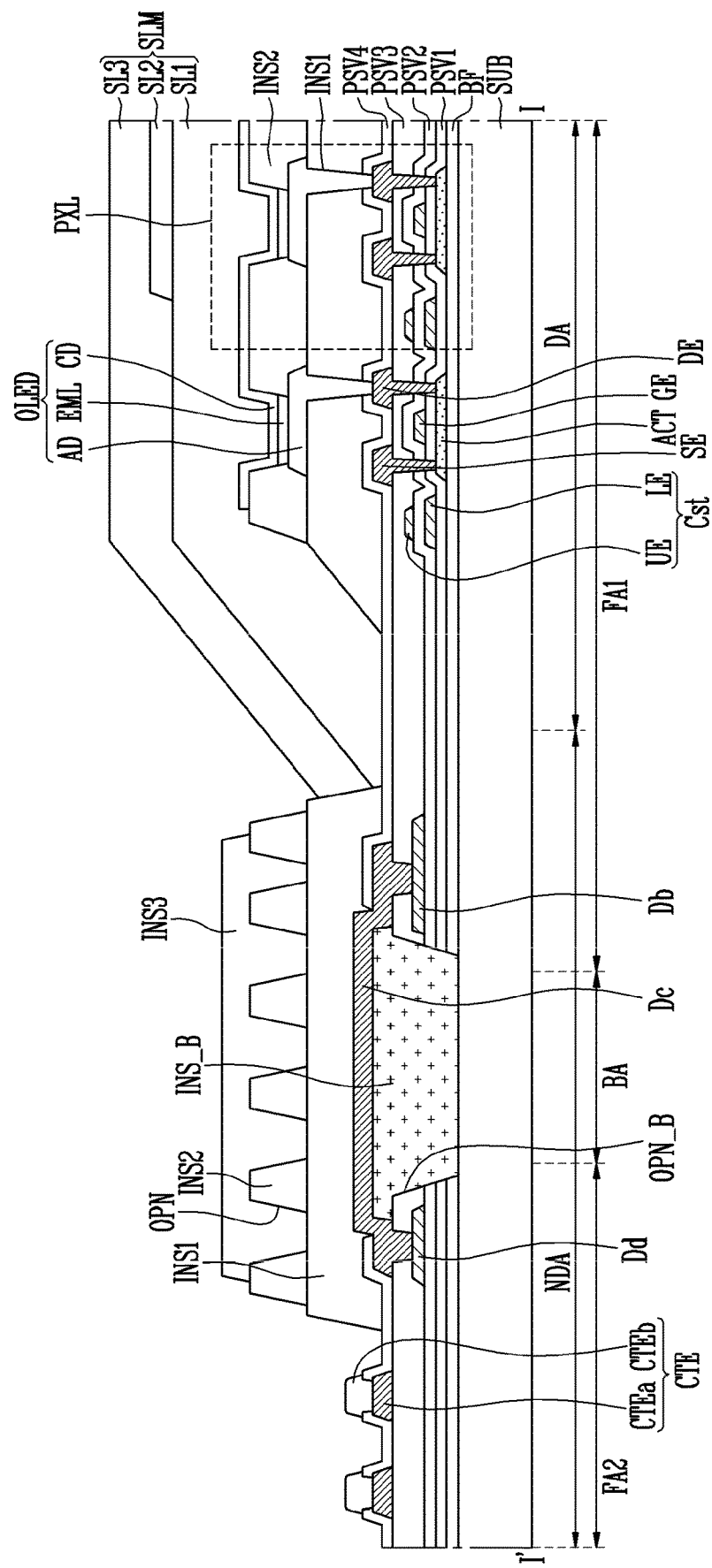
FIG. 3 is a cross-sectional view of the display device of FIG. 2, taken along the line I-I'.

FIG. 3 is a cross-sectional view taken along the line I-I' of FIG. 2.

According to FIG. 3, a pixel unit PXL is provided in the display region DA, and a bent region BA is provided in the non-display region NDA existing at a side of the display region DA.

First, a substrate SUB, a buffer layer BF, first to fourth passivation layers PSV1 to PSV4, first and second insulating layers INS1 and INS2, and an encapsulation layer SLM are sequentially provided in the pixel unit PXL.

The substrate SUB may be made of an insulative material, such as glass or resin. Also, the substrate SUB may be made of a material having flexibility to be bendable or foldable. The substrate SUB may have a single- or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and polyurethane. However, the material constituting the substrate SUB may be variously changed, and the substrate SUB may be made of fiberglass reinforced plastic (FRP), or the like.

The buffer layer BF may be provided on the substrate SUB. The buffer layer BF prevents or substantially prevents impurities from being diffused into switching and driving transistors. The buffer layer BF may be provided as a single layer, or may be provided as a multi-layer including at least two layers.

The buffer layer BF may be an inorganic insulating layer made of an inorganic material. For example, the buffer layer BF may be formed of silicon nitride, silicon oxide, silicon oxynitride, etc. When the buffer layer BF is provided as a multi-layer, layers of the multi-layer may be formed of materials equal to or different from each other. However, the buffer layer BF may be omitted according to material and process conditions.

Active patterns ACT may be provided on the buffer layer BF. The active patterns ACT are formed of a semiconductor material. Each of the active patterns ACT may include a source region, a drain region, and a channel region provided between the source region and the drain region. The active pattern ACT may be a semiconductor pattern made of poly-silicon, amorphous silicon, oxide semiconductor, etc. The channel region is a semiconductor pattern undoped with impurities, and may be an intrinsic semiconductor. The source region and the drain region are semiconductor patterns doped with impurities. The impurities may include impurities such as an n-type impurity, a p-type impurity, and other metals.

The first passivation layer PSV1 may be provided on the buffer layer BF on which the active pattern ACT is provided. The first passivation layer PSV1 may be an inorganic insulating layer made of an inorganic material, or may be an organic insulating layer made of an organic material. The inorganic material may include any of inorganic insulating materials, such as polysiloxane, silicon nitride, silicon oxide, and silicon oxynitride. The organic material may include any of organic insulating materials, such as a polyacryl-based compound, a polyimide-based compound, a fluorine-based polymer compound including Teflon, and a benzocyclobutene-based compound.

A gate electrode GE and a capacitor lower electrode LE may be provided on the first passivation layer PSV1. The gate electrode GE may be formed to cover a region corresponding to the channel region of the active pattern ACT.

The gate electrode GE and the capacitor lower electrode LE may be made of a metal. For example, the gate electrode GE may be made of at least one of metals such as gold (Au), silver (Ag), aluminum (Al), molybdenum (Mo), chromium (Cr), titanium (Ti), nickel (Ni), neodymium (Nd), and copper (Cu), or alloys of the metals. Also, the gate electrode GE may be formed in a single layer. However, the present disclosure is not limited thereto, and the gate electrode GE may be formed in a multi-layer in which two or more materials among the metals and the alloys are stacked.

In an embodiment of the present disclosure, although not shown in the drawing, other lines including scan lines may be formed of the same material in the same layer as the gate electrode GE and the capacitor lower electrode LE. Here, the other lines including the scan lines may be directly or indirectly connected to a portion of the transistor in each pixel unit PXL, e.g., the gate electrode GE.

The second passivation layer PSV2 may be provided on the first passivation layer PSV1 on which the gate electrode GE and the capacitor lower electrode LE are provided. The second passivation layer PSV2 may be an inorganic insulating layer made of an inorganic material. The inorganic material may include polysiloxane, silicon nitride, silicon oxide, and silicon oxynitride.

A capacitor upper electrode UE may be provided on the second passivation layer PSV2. The capacitor upper electrode UE may be made of a metal. For example, the capacitor upper electrode UE may be made of at least one of metals such as gold (Au), silver (Ag), aluminum (Al), molybdenum (Mo), chromium (Cr), titanium (Ti), nickel (Ni), neodymium (Nd), and copper (Cu), or alloys of the metals. Also, the capacitor upper electrode UE may be formed in a single layer. However, the present disclosure is not limited thereto, and the capacitor upper electrode UE may be formed in a multi-layer in which two or more materials among the metals and the alloys are stacked.

The capacitor lower electrode LE and the capacitor upper electrode UE constitute a capacitor Cst with the second passivation layer PSV2 interposed therebetween. In an embodiment of the present disclosure, a case in which the capacitor Cst is configured with the capacitor lower electrode LE and the capacitor upper electrode UE is illustrated. However, the present disclosure is not limited thereto, and the capacitor Cst may be implemented in various manners.

The third passivation layer PSV3 may be provided on the second passivation layer PSV2 on which the capacitor upper electrode UE is provided. The third passivation layer PSV3 may be an organic insulating layer including an organic material. The organic material may include any of organic insulating materials, such as a polyacryl-based compound, a polyimide-based compound, a fluorine-based polymer compound including Teflon, and a benzocyclobutene-based compound.

A source electrode SE and a drain electrode DE may be provided on the third passivation layer PSV3. The source electrode SE and the drain electrode DE may be in contact with the source region and the drain region of the active pattern ACT through contact holes formed in the second passivation layer PSV2 and the first passivation layer PSV1, respectively.

The source electrode SE and the drain electrode DE may be made of a metal. For example, the source electrode SE and the drain electrode DE may be made of at least one of metals such as gold (Au), silver (Ag), aluminum (Al), molybdenum (Mo), chromium (Cr), titanium (Ti), nickel (Ni), neodymium (Nd), and copper (Cu), or alloys of the metals. Also, the source electrode SE and the drain electrode DE may be formed in a single layer. However, the present disclosure is not limited thereto, and the source electrode SE and the drain electrode DE may be formed in a multi-layer in which two or more materials among the metals and the alloys are stacked.

In an embodiment of the present disclosure, although not shown in the drawing, data lines or first power lines may be formed of the same material in the same layer as the source electrode SE and the drain electrode DE. Here, the data lines or the first power lines may be directly or indirectly connected to a portion of the transistor in each pixel unit PXL, e.g., the source electrode SE and/or the drain electrode DE.

The fourth passivation layer PSV4 and the first insulating layer INS1 may be provided on the third passivation layer PSV3 on which the source electrode SE and the drain electrode DE are provided.

The first insulating layer INS1 may be an organic insulating layer made of an organic material. The organic material may include any of organic insulating materials, such as a polyacryl-based compound, a polyimide-based compound, a fluorine-based polymer compound including Teflon, and a benzocyclobutene-based compound. The first insulating layer INS1 may include a plurality of layers, and each layer included in the first insulating layer INS1 may be formed of the above-described organic insulating material. The layers of the first insulating layer INS1 may be formed of different organic insulating materials.

A light emitting device OLED may be provided on the first insulating layer INS1. The light emitting device OLED may include a first electrode AD, an emitting layer EML, and a second electrode CD.

The first electrode AD may be provided on the first insulating layer INS1. The first electrode AD may be connected to the drain electrode DE through a contact hole passing through the first insulating layer INS1.

The second insulating layer INS2 that defines a light emitting region to correspond to each pixel unit PXL may be provided on the first insulating layer INS1 on which the first electrode AD is provided. The second insulating layer INS2 may expose an upper surface of the first electrode AD therethrough and protrude from the first insulating layer INS1 along the circumference of the pixel unit PXL.

The emitting layer EML may be provided in the light emitting region protruding from the first insulating layer INS1, and the second electrode CD may be provided on the emitting layer EML.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the light emitting device OLED is a bottom-emission light emitting device, the first electrode AD may be a transmissive electrode, and the second electrode CD may be a reflective electrode. When the light emitting device OLED is a top-emission light emitting device, the first electrode AD may be a reflective electrode, and the second electrode CD may be a transmissive electrode. When the light emitting device OLED is a dual-emission light emitting device, both of the first electrode AD and the second electrode CD may be transmissive electrodes. In this embodiment, a case in which the light emitting device OLED is a top-emission light emitting device and the first electrode AD is an anode electrode is described as an example.

The first electrode AD may include a reflective layer (not shown) capable of reflecting light and a transparent conductive layer (not shown) disposed over or under the reflective layer. At least one of the transparent conductive layer and the reflective layer may be connected to the drain electrode DE.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The second insulating layer INS2 may include an organic insulating material. For example, the second insulating layer INS2 may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The second insulating layer INS2 may include a plurality of layers, and each layer included in the second insulating layer INS2 may be formed of the above-described organic insulating material. In an embodiment, the layers of the second insulating layer INS2 may be formed of different organic insulating material.

The emitting layer EML may be disposed on the exposed surface of the first electrode AD. The emitting layer EML may have a multi-layered thin film structure including at least a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons. In the emitting layer EML, the HIL, HTL, HBL, ETL, and EIL may be common layers commonly disposed in adjacent pixel units PXL.

The LGL may include a low-molecular or high-molecular material. The low-molecular material may include any of copper phthalocyanine (CuPc), N,N'-Di(naphthalene-1-yl)-N,N'-diphenyl-benzidine (NPB), tris-8-hydroxyquinoline aluminum ($Alq_3$), and the like. These materials may be formed through vacuum deposition. The high-molecular material may include any of poly(3,4-ethylenedioxythiophene) (PEDOT)-, poly(phenylene-vinylene) (PPV)-, and poly(fluorine)-based materials.

The color of light generated in the LGL may be one of red, green, blue, and white, but embodiments are not limited thereto. For example, the color of light generated in the LGL may also be one of magenta, cyan, and yellow.

The second electrode CD may be a semi-transmissive reflective layer. For example, the second electrode CD may be a thin metal layer having a thickness, through which light emitted through the emitting layer EML can be transmitted. The second electrode CD may allow a portion of the light emitted from the emitting layer EML to be transmitted therethrough, and allow the rest of the light emitted from the emitting layer EML to be reflected therefrom.

The second electrode CD may include a material having a work function lower than that of the transparent conductive layer of the first electrode AD. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the organic light emitting device OLED can be improved by the resonance of the light.

The distance between the reflective layer and the second electrode CD may be changed depending on a color of the light emitted from the emitting layer EML. That is, the distance between the reflective layer and the second electrode CD may be adjusted to correspond to a resonance distance, depending on a color of the light emitted from the emitting layer EML.

The encapsulation layer SLM may be provided over the second electrode CD. The encapsulation layer SLM may be formed in a single layer, or may be formed in a multi-layer. In an embodiment of the present disclosure, the encapsulation layer SLM may include first to third encapsulation layers SL1 to SL3. The first to third encapsulation layers SL1 to SL3 may include an organic material and/or an inorganic material. The third encapsulation layer SL3 located at the outermost portion may include an inorganic material.

In an embodiment of the present disclosure, the first encapsulation layer SL1 may include an inorganic material, the second encapsulation layer SL2 may include an organic material or an inorganic material, and the third encapsulation layer SL3 may include an inorganic material. As compared with the organic material, moisture or oxygen penetrates into the inorganic material to a lesser extent, but the inorganic material may be weak to cracks due to its low elasticity or flexibility. In an embodiment, the first encapsulation layer SL1 and the third encapsulation layer SL3 are formed of an inorganic material, and the second encapsulation layer SL2 is formed of an organic material, such that the propagation of cracks can be prevented or substantially prevented. Here, when the second encapsulation layer SL2 includes an organic material, the second encapsulation layer SL2 may be completely covered by the third encapsulation layer SL3 such that an end portion of the second encapsulation layer SL2 is not exposed to the outside.

The encapsulation layer SLM is provided on the display region DA, and may not cover the bent region BA. This is because, when the encapsulation layer SLM includes an inorganic material, an inorganic material layer of the encapsulation layer SLM may be damaged when the bent region BA is bent. In addition, this is because moisture or humidity may penetrate into the pixel unit PXL under the encapsulation layer SLM through an organic material layer provided in the bent region BA.

In an embodiment of the present disclosure, the organic material may include any of organic insulating materials, such as a polyacryl-based compound, a polyimide-based compound, a fluorine-based polymer compound including Teflon, and a benzocyclobutene-based compound. The inorganic material may include any of polysiloxane, silicon nitride, silicon oxide, silicon oxynitride, and the like. When the second encapsulation layer SL2 includes an inorganic material instead of an organic material, the inorganic material may include any of various silicon-based insulating materials, e.g., hexamethyldisiloxane (HMDSO), octamethylcyclotetrasiloxane (OMCTSO), tetramethyldisiloxane (TMDSO), tetraethyleorthosilicate (TEOS), and the like. In an embodiment of the present disclosure, the emitting layer EML of the light emitting device OLED may be easily damaged by moisture or oxygen from the outside. The encapsulation layer SLM protects the light emitting layer EML by covering the light emitting layer EML. The encapsulation layer SLM covers the display region DA, and may extend up to the outside of the display region DA.

Next, the non-display region NDA will be described. Herein, as for the non-display region NDA, components that have already been described may be omitted or briefly described to avoid redundancy.

In an embodiment of the present disclosure, a plurality of lines may be provided in the non-display region NDA, and the non-display region NDA may have the bent region BA in which the substrate SUB is bent. The lines may be data lines Db, Dc, and Dd.

The buffer layer BF is provided on the non-display region NDA of the substrate SUB.

The first passivation layer PSV1 may be provided on the buffer layer BF. The data lines Db, Dc, and Dd may be provided on the first passivation layer PSV1. The data lines Db, Dc, and Dd may be formed of a same material through a same process as the gate electrode GE.

The second passivation layer PSV2 may be provided over the data lines Db, Dc, and Dd.

Regions of the buffer layer BF, the first passivation layer PSV1, and the second passivation layer PSV2, which correspond to the bent region BA, may be removed. That is, the buffer layer BF, the first passivation layer PSV1, and the second passivation layer PSV2 may have an opening OPN_B that exposes the substrate SUB therethrough in the regions corresponding to the bent region BA.

In some embodiments, the region corresponding to the bent region BA may not be removed at a portion of the buffer layer BF, the first passivation layer PSV1, and the second passivation layer PSV2. For example, the region of the buffer layer BF, which corresponds to the bent region BA, may not be removed, and the regions of the other insulating layers, i.e. the first passivation layer PSV1, the second passivation layer PSV2, and the third and fourth passivation layers PSV3 and PSV4, which correspond to the bent region BA, may be removed to form the opening OPN_B.

That the opening OPN_B corresponds to the bent region BA may be understood as that the opening OPN_B overlaps with the bent region BA. The area of the opening OPN_B may be wider than that of the bent region BA. In an embodiment of the present disclosure, although it is illustrated that the width of the opening OPN_B is equal to that of the bent region BA, this is provided for convenience of description, and the width of the opening OPN_B may be wider than that of the bent region BA.

For reference, in FIG. 3, it is illustrated that inner side surfaces of the buffer layer BF, the first passivation layer PSV1, and the second passivation layer PSV2 are all disposed on a straight line, but the present disclosure is not limited thereto. For example, the area of the opening of the buffer layer BF may be larger than that of the opening of the first passivation layer PSV1 and the second passivation layer PSV2. In an embodiment of the present disclosure, the area of the opening of the buffer layer BF may be smaller than the area of the opening of the first passivation layer PSV1 and the area of the opening of the second passivation layer PSV2.

A bent insulating layer INS_B is provided in the opening OPN_B. The bent insulating layer INS_B is filled in at least a portion of the opening OPN_B, and a case in which the opening OPN_B is completely filled with the bent insulating layer INS_B is illustrated in FIG. 3. In an embodiment of the present disclosure, the bent insulating layer INS_B may be filled in the opening OPN_B and simultaneously cover a partial upper portion of the first insulating layer INS1, which corresponds to a region adjacent to the opening OPN_B, e.g., the first flat region FA1 and/or the second flat region FA2.

The bent insulating layer INS_B may be an organic insulating layer made of an organic material. The organic material may include any of organic insulating materials, such as a polyacryl-based compound, a polyimide-based compound, a fluorine-based polymer compound including Teflon, and a benzocyclobutene-based compound.

A line Dc is provided on the first insulating layer INS1 and the bent insulating layer INS_B. In addition, lower contact electrodes CTEa are provided on the first insulating layer INS1. Upper contact electrodes CTEb are provided on the lower contact electrodes CTEa. The line Dc and the lower contact electrode CTEa may be formed of a same material through a same process as the source electrode SE and the drain electrode DE. The line Dc extends from the first flat region FA1 to the second flat region FA2 via the bent region BA, and is located on the bent insulating layer INS_B. The line Dc may be located on the first insulating layer INS1 at a portion at which the bent insulating layer INS_B is not provided.

As described above, a case in which the display device is in a state in which it is not bent is illustrated in FIG. 3. However, in an embodiment of the present disclosure, the display device may be bent in the bent region BA. In an embodiment of the present disclosure, the display device may be manufactured in its flat state, and may then be bent in a subsequent process.

According to an embodiment of the present disclosure, a first insulating layer INS1, a second insulating layer INS2 that is provided on the first insulating layer INS1 and includes at least one opening OPN, and a third insulating layer INS3 provided on the second insulating layer INS2 and the opening OPN may be provided on the bent region BA.

The third insulating layer INS3 protects the bent region BA. When the bent region BA of the display device is bent, the bent region BA receives a large amount of stress as compared with a region that is not bent. Therefore, the bent region BA may be particularly weak to external impact in the state in which it is bent. As the third insulating layer INS3 protects the bent region BA, the bent region BA is not damaged by the external impact, even in the state in which it is bent. However, a third insulating layer provided to protect a bent region may be easily separated from a display device.

Herein, the first to third insulating layers INS1 to INS3 provided on the bent region BA will be described in further detail with reference to FIGS. 4A, 4B, 5A, and 5B.

Figure 4A:
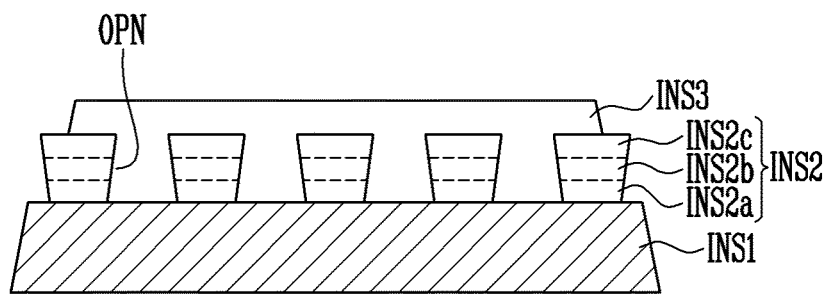
FIGS. 4A and 4B are cross-sectional views illustrating first to third insulating layers provided on a bent region.
Figure 4B:
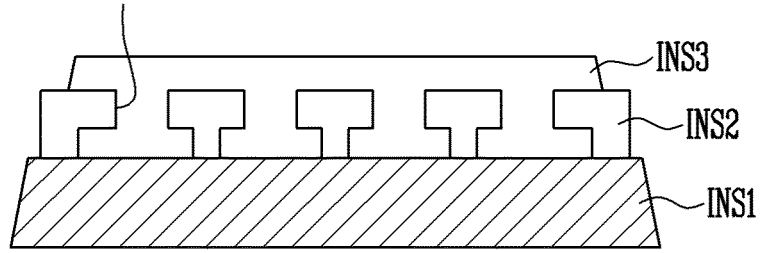
Figure 5A:
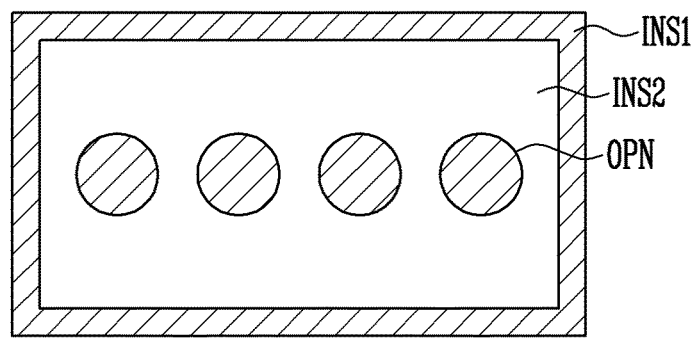
FIGS. 5A and 5B are plan views illustrating the first insulating layer and the second insulating layer of FIGS. 4A and 4B, which are provided on the bent region.
Figure 5B:
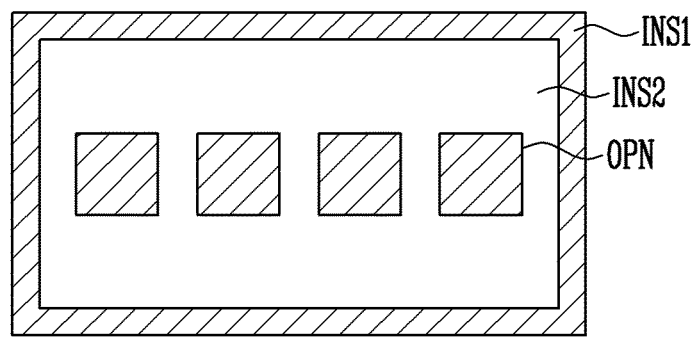

FIGS. 4A and 4B are cross-sectional views illustrating the first to third insulating layers provided on the bent region. FIGS. 5A and 5B are plan views illustrating the first insulating layer and the second insulating layer, which are provided on the bent region.

According to the present disclosure, the second insulating layer INS2 has at least one opening OPN. The second insulating layer INS2 allows a portion of the first insulating layer INS1 to be exposed by the opening OPN. A surface of the exposed first insulating layer INS1 meets the third insulating layer INS3. Thus, the third insulating layer INS3 has a shape that is in contact with not only the second insulating layer INS2 but also the first insulating layer INS1. As the third insulating layer INS3 has the above-described shape, the contact area of the third insulating layer INS3 with the first and second insulating layers INS1 and INS2 increases. Accordingly, the adhesion between the third insulating layer INS3 and the first and second insulating layers INS1 and INS2 can be improved.

The opening OPN may be provided in a plurality from the point of view of improving the contact area and adhesion between the third insulating layer INS3 and the first and second insulating layers INS1 and INS2. However, the number of openings OPN included in the second insulating layer INS2 is not limited. Those skilled in the art may form an appropriate number of openings OPN by considering the thickness, material, area, etc. of each of the insulating layers INS1, INS2, and INS3. Therefore, those skilled in the art may form the second insulating layer INS2 having openings OPN of which number is more or less than that of the openings OPN shown in the drawings.

As described above, the first insulating layer INS1 and the second insulating layer INS2 may include an organic insulating material. Also, the first insulating layer INS1 and the second insulating layer INS2 may have a multi-layered structure including a plurality of sub-insulating layers. In an embodiment, the second insulating layer INS2 may have three sub-insulating layers INS2a, INS2b and INS2c as shown in FIG. 4A.

The third insulating layer INS3 may include any of an organic material, an inorganic material, and an organic/inorganic complex material. The organic material may include any of organic insulating materials, such as a polyacryl-based compound, a polyimide-based compound, a fluorine-based polymer compound including Teflon, and a benzocyclobutene-based compound. The inorganic material may include any of polysiloxane, silicon nitride, silicon oxide, silicon oxynitride, and the like. When the third insulating layer INS3 includes an inorganic material instead of an organic material, the inorganic material may include any of various silicon-based insulating materials, e.g., hexamethyldisiloxane (HMDSO), octamethylcyclotetrasiloxane (OMCTSO), tetramethyldisiloxane (TMDSO), tetraethylorthosilicate (TEOS), and the like.

When the second insulating layer INS2 includes a plurality of sub-insulating layers, the sub-insulating layers may include openings OPN having different diameters. Therefore, the diameter of the opening OPN may be varied depending on a distance from the first insulating layer INS1 in the second insulating layer INS2.

For example, as the sub-insulating layer is closer to the first insulating layer INS1, the sub-insulating layer may include the opening OPN having a larger diameter. In this case, the opening OPN may have a trapezoidal vertical cross-section. When the opening OPN has the trapezoidal vertical cross-section, the third insulating layer INS3 can be more stably stacked in the display device. When the bent region BA of the display device is bent, the third insulating layer INS3 may receive a force in the normal direction of the substrate SUB. The force in the above-described direction may become a factor that causes the third insulating layer INS3 to be separated from the display device. When the third insulating layer INS3 has a trapezoidal section, a portion of the third insulating layer INS3 is provided under the second insulating layer INS2, and hence the second insulating layer INS2 can stabilize the third insulating layer INS3. That is, when a force is applied to the third insulating layer INS3 in the normal direction of the substrate SUB, the second insulating layer INS2 stabilizes a portion of the third insulating layer INS3, such that the third insulating layer INS3 can be prevented or substantially prevented from being separated from the display device.

However, the diameter of the opening OPN may not be continuously in proportion or inverse proportion to the distance from the first insulating layer INS1, even when the second insulating layer INS2 has the opening OPN having a diameter that varies depending on the distance from the first insulating layer INS1. In some cases, the diameter of the opening OPN may be discontinuously changed. For example, the opening OPN may have a vertical section with a concave shape as shown in FIG. 4B. However, in addition to the shape shown in FIG. 4B, the opening OPN may have vertical sections with any of various shapes.

According to some embodiments, shapes of the opening OPN, which are viewed from the top, are illustrated in FIGS. 5A and 5B. However, the shape of the opening OPN is not limited to those shown in the drawings. The shape of the opening OPN may be varied depending on the shape of a mask, for example. Therefore, the opening OPN may have any of various shapes, such as a circular shape, an elliptical shape, a square shape, a rectangular shape, and a star shape.

When a plurality of openings OPN is provided in the second insulating layer INS2, shapes of the openings OPN may not necessarily be the same. Therefore, the shapes of the openings OPN may be different from one another. Here, the shape of the opening OPN includes the horizontal cross-sectional shape of the opening OPN, the vertical cross-sectional shape of the opening OPN, and the diameter of the opening OPN.

When the bent region BA of the display device is bent, an inside, particularly, a central portion of the bent region BA receives a large amount of stress as compared to an edge of the bent region BA, and, hence, the shape of the opening OPN may be varied depending on its position on the second insulating layer INS2. For example, when viewed on a plane, the opening OPN located at the inside of the bent region BA may have a diameter larger than that of the opening OPN located at the edge of the bent region BA as shown in FIG. 3. Accordingly, the third insulating layer INS3 located at the inside of the bent region BA can be prevented or substantially prevented from being separated from the display device when the display device is bent.

In an embodiment, the bent region BA of the substrate SUB may be folded to have a radius of curvature of 5 mm or less. The radius of curvature may be half of the distance between two ends of the bent region BA which are opposite to each other. In an embodiment, the bent region BA has the above-described radius of curvature, such that it is possible to manufacture a folded display device. Accordingly, a portion of the display device, e.g., the line unit and the driving unit can be folded to be located under the display region.

The depth of the opening OPN may be smaller than the thickness of the third insulating layer INS3. Here, the thickness of the third insulating layer INS3 means an average thickness of the third insulating layer INS3. Since the thickness of the third insulating layer INS3 provided on the opening OPN is larger than a thickness of the third insulating layer INS3 provided in a region in which the opening OPN is not provided, the thickness of the third insulating layer INS3 may be varied depending on its position on a plane.

In an embodiment, the diameter of the opening OPN may be about 0.5 μm to about 2 μm. When the diameter of the opening OPN is less than about 0.5 μm, the effect of the opening OPN that prevents or substantially prevents the third insulating layer INS3 from being separated from the display device may be insignificant. In addition, when the diameter of the opening OPN exceeds about 2 μm, the contact area between the second insulating layer INS2 and the first insulating layer INS1 is small, and, therefore, the second insulating layer INS2 may be easily separated from the first insulating layer INS1.

In an embodiment, the distance from the upper surface of the second insulating layer INS2 to the upper surface of the third insulating layer INS3 may be about 30 μm to about 150 μm. When the thickness of the third insulating layer INS3 is less than about 30 μm, the effect of the third insulating layer INS3 that protects the bent region BA may be insufficient. In addition, when the thickness of the third insulating layer INS3 exceeds about 150 μm, the third insulating layer INS3 may be easily separated from the display device, even when the second insulating layer INS2 and the third insulating layer INS3 have the shapes provided in the present disclosure.

In an embodiment, the thickness of the second insulating layer INS2 may be about 5 μm to about 10 μm, and, as the second insulating layer INS2 has the above-described thickness, the second insulating layer INS2 can easily form the opening OPN while protecting the bent region BA. When the thickness of the second insulating layer INS2 is less than about 5 μm, the bent region BA may not be sufficiently protected from external impact. When the thickness of the second insulating layer INS2 exceeds about 10 μm, it may be difficult to form the opening OPN in the second insulating layer INS2.

The display device may include a plurality of lines in the bent region BA, and the openings OPN may be provided between the plurality of lines. Therefore, the openings OPN may be provided in the form of a plurality of rows. As the openings OPN are provided in the above-described form, the third insulating layer INS3 can be prevented or substantially prevented from being separated from the first and second insulating layers INS1 and INS2, even when the bent region BA is bent in any direction. When the openings OPN are provided on a plurality of rows, the same number of openings OPN may not necessarily be provided for every row. For example, numbers of openings OPN may be different for every row, and shapes of the openings OPN may be different for every row.

The opening OPN may be formed using any of various methods.

For example, the opening OPN may be formed using a photolithography method. In this case, the opening OPN and the second and third insulating layers INS2 and INS3 may be formed by forming the second insulating layer INS2, patterning the second insulating layer INS2 to have the opening OPN, using a mask, and then applying the third insulating layer INS3 onto the second insulating layer INS2.

As the shape of the mask is varied, the shape of the opening OPN may also be varied. Therefore, it is relatively simple that the shape of the opening OPN is varied.

When the second insulating layer INS2 includes a plurality of sub-insulating layers, the process of forming the opening OPN using the mask may be performed for every sub-insulating layer. In this case, the process may be performed such that the sub-insulating layers have openings with different diameters. For example, when the second insulating layer INS2 includes a first sub-insulating layer and a second sub-insulating layer, which are sequentially stacked, the process may be performed by controlling the shape of the mask such that the first sub-insulating layer has an opening with a diameter larger than that of second sub-insulating layer.

In an embodiment, the opening OPN may be formed using an etching process. In this case, the opening OPN may be formed to have an under-cut shape, such as using wet etching.

The second insulating layer INS2 of the bent region BA may be formed together with the second insulating layer INS2 of the pixel unit PXL in a process of forming the second insulating layer INS2 of the pixel unit PXL. Therefore, the second insulating layer INS2 of the bent region BA and the second insulating layer INS2 of the pixel unit PXL may be formed of a same material, and may have a same thickness.

In an embodiment, the opening OPN may be formed in a patterning process of the second insulating layer INS2, in which the emitting layer EML is provided in the second insulating layer INS2.

However, in addition to the above-described method, any of various methods may be used to form the second insulating layer INS2, the third insulating layer INS3, and the opening OPN.

Figure 6:
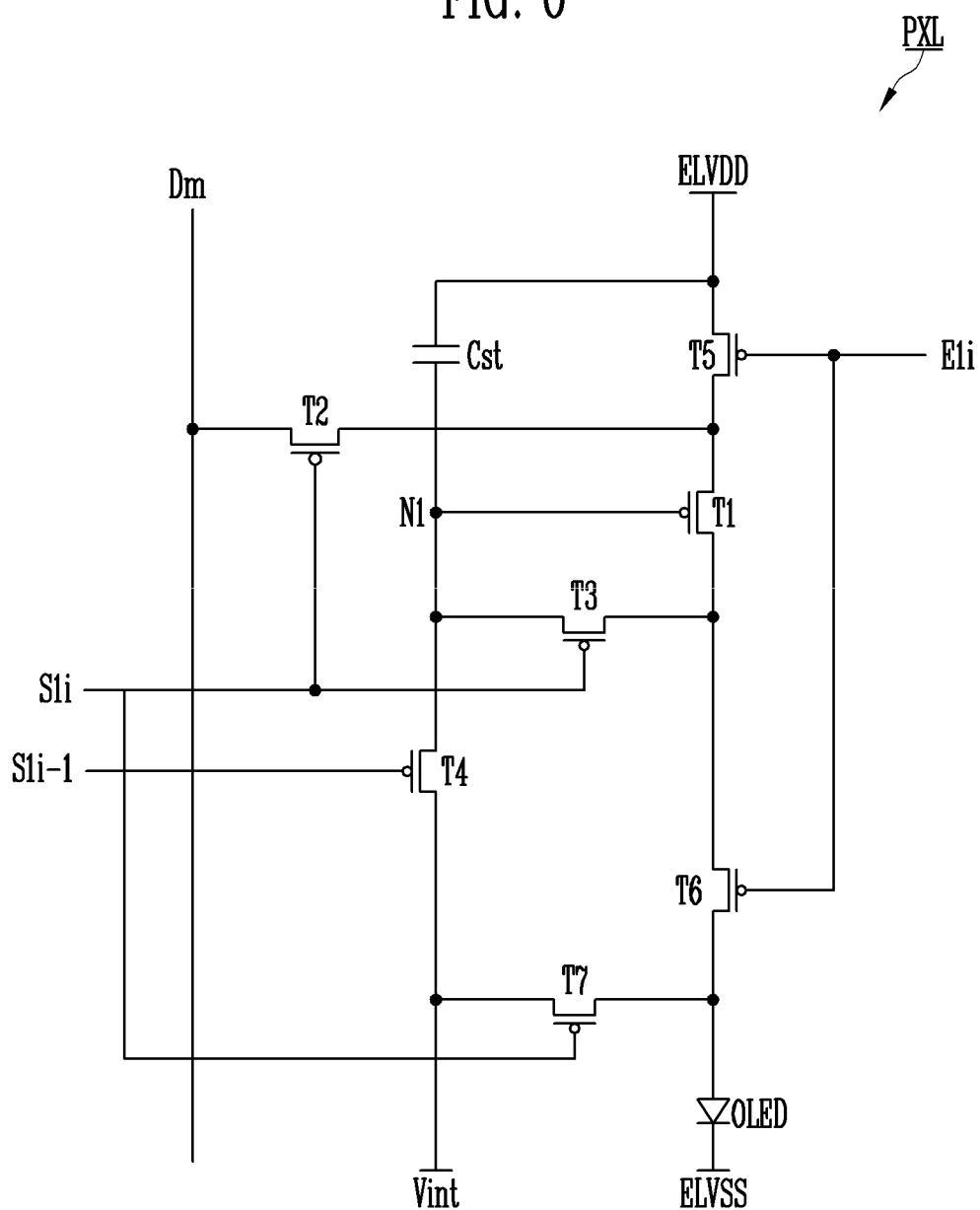
FIG. 6 is a view illustrating an embodiment of a pixel unit shown in FIG. 2.

FIG. 6 is a view illustrating an embodiment of the pixel unit PXL shown in FIG. 2. For convenience of description, a pixel unit connected to an mth data line Dm and an ith first scan line S1$i$ is illustrated.

Referring to FIG. 6, the pixel unit PXL according to an embodiment of the present disclosure includes an organic light emitting device OLED, first to seventh transistors T1 to T7, and a storage capacitor Cst.

An anode of the organic light emitting diode OLED is connected to the first transistor T1 via the sixth transistor T6, and a cathode of the organic light emitting diode OLED is connected to a second power source ELVSS. The organic light emitting device OLED generates light with a luminance (e.g., a predetermined luminance) corresponding to the amount of current supplied from the first transistor T1.

The voltage of a first power source ELVDD may be set higher than that of the second power source ELVSS such that current can flow through the organic light emitting device OLED.

The seventh transistor T7 is connected between an initialization power source Vint and the anode of the organic light emitting device OLED. In addition, a gate electrode of the seventh transistor T7 is connected to the ith first scan line S1i. The seventh transistor T7 is turned on when a scan signal is supplied to the ith first scan signal S1i, to supply the voltage of the initialization power source Vint to the anode of the organic light emitting device OLED. Here, the initialization power source Vint may be set to a voltage lower than that of a data signal.

The sixth transistor T6 is connected between the first transistor T1 and the organic light emitting device OLED. In addition, a gate electrode of the sixth transistor T6 is connected to an ith first emission control line E1i. The sixth transistor T6 is turned off when an emission control signal is supplied to the ith first emission control line E1i, and is turned on otherwise.

The fifth transistor T5 is connected between the first power source ELVDD and the first transistor T1. In addition, a gate electrode of the fifth transistor T5 is connected to the ith first emission control line E1i. The fifth transistor T5 is turned off when the emission control signal is supplied to the ith first light emitting control line E1i, and is turned on otherwise.

A first electrode of the first transistor (drive transistor) T1 is connected to the first power source ELVDD via the fifth transistor T5, and a second electrode of the first transistor T1 is connected to the anode of the organic light emitting device OLED via the sixth transistor T6. In addition, a gate electrode of the first transistor T1 may be connected to a first node N1. The first transistor T1 may control the amount of current flowing from the first power source ELVDD to the second power source ELVSS via the organic light emitting device OLED, corresponding to a voltage of the first node N1.

The third transistor T3 is connected between the second electrode of the first transistor T1 and the first node N1. In addition, a gate electrode of the third transistor T3 is connected to the ith scan line S1i. The third transistor T3 is turned on when the scan signal is supplied to the ith first scan line S1i, to allow the second electrode of the first transistor T1 to be electrically connected to the first node N1. Therefore, when the third transistor T3 is turned on, the first transistor T1 is diode-connected.

The fourth transistor T4 is connected between the first node N1 and the initialization power source Vint. In addition, a gate electrode of the fourth transistor T4 is connected to an (i−1)th first scan line S1i−1. The fourth transistor T4 is turned on when a scan signal is supplied to the (i−1)th first scan line S1i−1, to supply the voltage of the initialization power source Vint to the first node N1.

The second transistor T2 is connected between the mth data line Dm and the first electrode of the first transistor T1. In addition, a gate electrode of the second transistor T2 is connected to the ith first scan line S1i. The second transistor T2 is turned on when the scan signal is supplied to the ith first scan line S1i, to allow the mth data line Dm to be electrically connected to the first electrode of the first transistor T1.

The storage capacitor Cst is connected between the first power source ELVDD and the first node N1. The storage capacitor Cst stores a voltage corresponding to the data signal and the threshold voltage of the first transistor T1.

Figure 7:
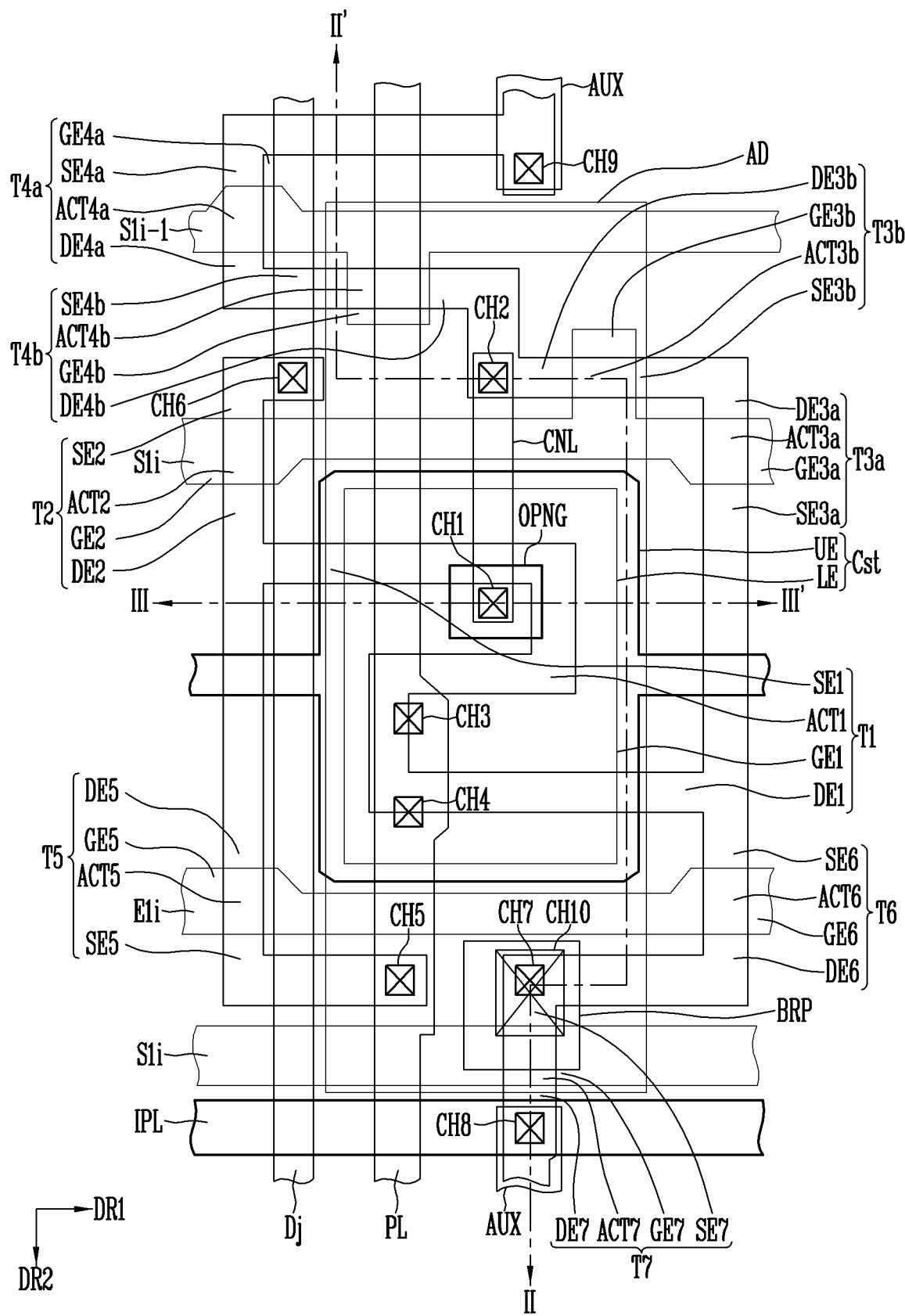
FIG. 7 is a plan view illustrating a pixel unit of FIG. 2.
Figure 8:
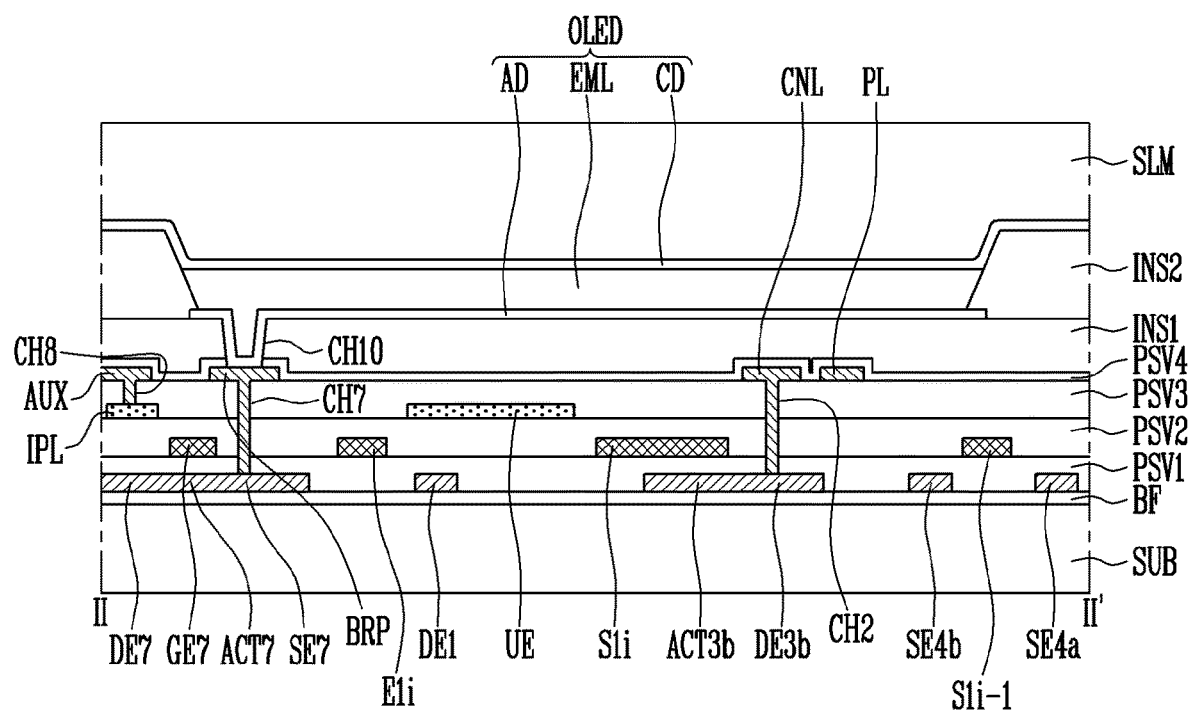
FIG. 8 is a cross-sectional view taken along the line II-II' of FIG. 7.
Figure 9:
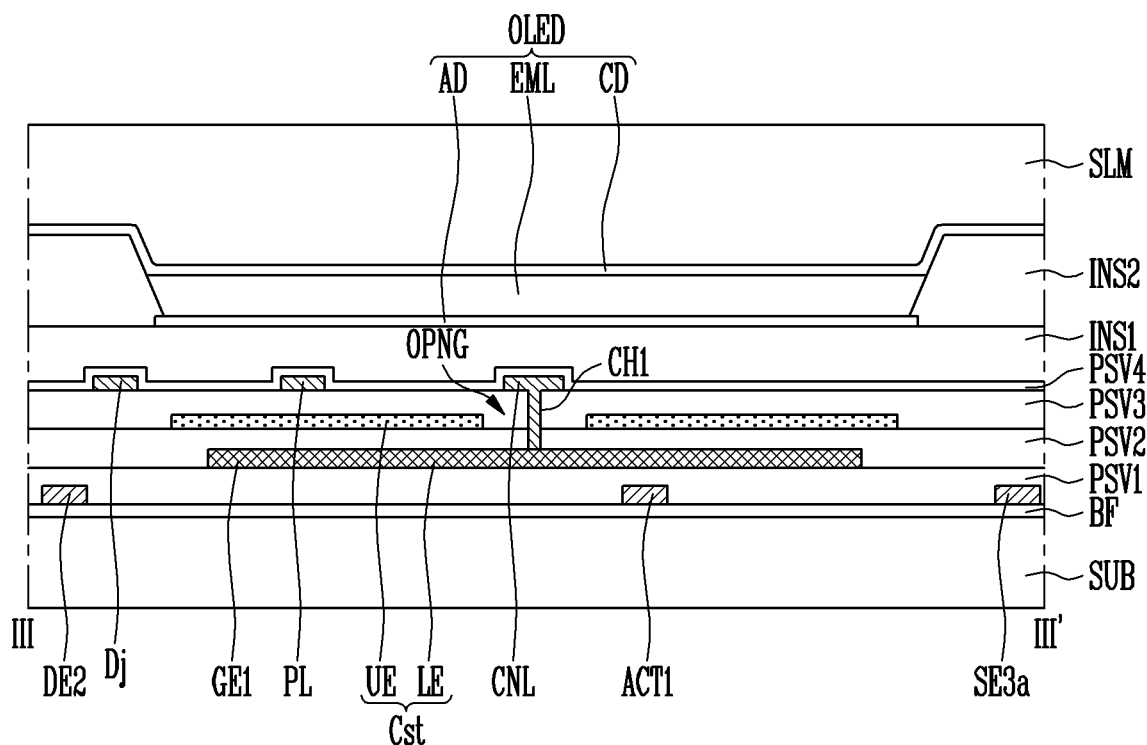
FIG. 9 is a cross-sectional view taken along the line III-III' of FIG. 7.

FIG. 7 is a plan view illustrating the pixel unit PXL of FIG. 2. FIG. 8 is a cross-sectional view taken along the line II-II' of FIG. 7. FIG. 9 is a cross-sectional view taken along the line III-III' of FIG. 7.

In FIGS. 7 to 9, there are illustrated two first scan lines S1i−1 and S1i, a first emission control line E1i, a power line PL, and a data line Dj, which are connected to a pixel unit PXL. In FIGS. 7 and 8, for convenience of description, a first scan line on an (i−1)th row is referred to as an "(i−1)th first scan line S1i−1," a first scan line on an ith row is referred to as an "ith first scan line S1i," a first emission control line on the ith row is referred to as a "first emission control line E1i," a data line on a jth column is referred to as a "data line Dj," and a power line on the jth column is referred to as a "power line PL."

The lines LP may provide signals to each pixel unit PXL, and may include first scan lines S1i−1 and S1i, a data line Dj, a first emission control line E1i, a power line PL, and an initialization power line IPL.

The first scan lines S1i−1 and S1i may extend in a first direction DR1. The first scan lines S1i−1 and S1i may include an (i−1)th first scan line S1i−1 and an ith first scan line S1i, which are sequentially arranged along a second direction DR2. The first scan lines S1i−1 and S1i may be applied with scan signals. For example, the (i−1)th first scan line S1i−1 may be applied with an (i−1)th first scan signal, and the ith first scan line S1i may be applied with an ith first scan signal. The ith first scan line S1i may branch off into two lines, and the branching-off ith first scan lines S1i may be connected to transistors different from each other. For example, the ith first scan line S1i may include an upper ith first scan line S1i adjacent to the (i−1)th first scan line S1i−1 and a lower ith first scan line S1i more distant from the (i−1)th first scan line S1i−1 than the upper ith first scan line S1i.

The first emission control line E1i may extend in the first direction DR1. The first emission control line E1i is disposed between two ith first scan lines S1i to be spaced apart from the ith first scan lines S1i. The first emission control line E1i may be applied with an emission control signal.

The data line Dj may extend in the second direction DR2. The data line Dj may be applied with a data signal.

The power line PL may extend along the second direction DR2. The power line PL may be disposed to be spaced apart from the data line Dj. The power line PL may be applied with the first power source ELVDD.

The initialization power line IPL may extend along the first direction DR1. The initialization power line IPL may be provided between the lower ith first scan line S1i and an (i−1)th first scan line S1i−1 of a pixel unit on a next row. The initialization power line IPL may be applied with the initialization power source Vint.

Each pixel unit PXL may include first to seventh transistors T1 to T7, a storage capacitor Cst, and a light emitting device OLED.

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may connect between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the first active pattern ACT1 may be formed of a semiconductor layer undoped with impurities.

In an embodiment, the first active pattern ACT1 has a bar shape extending in a predetermined direction, and may have a shape in which it is bent plural times along the extending direction. When viewed on a plane, the first active pattern ACT1 may overlap with the first gate electrode GE1. As the first active pattern ACT1 is formed long, a channel region of the first transistor T1 can be formed long. Thus, the driving range of a gate voltage applied to the first transistor T1 is widened. Accordingly, the gray scale of light emitted from the light emitting device OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the upper ith first scan line S1$i$. The second gate electrode GE2 may be provided as a portion of the upper ith first scan line S1$i$ or may be provided in a shape protruding from the upper ith first scan line S1$i$. In an embodiment of the present disclosure, the second active pattern ACT2, the second source electrode SE2, and the second drain electrode DE2 may be formed of a semiconductor undoped or doped with impurities. For example, the second source electrode SE2 and the second drain electrode DE2 may be formed of a semiconductor doped with impurities, and the second active pattern ACT2 may be formed of a semiconductor layer undoped with impurities. The second active pattern ACT2 may correspond to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

In an embodiment, the third transistor T3 may be provided in a double gate structure so as to prevent or substantially prevent a leakage current. That is, the third transistor T3 may include a 3ath transistor T3$a$ and a 3bth transistor T3$b$. The 3ath transistor T3$a$ may include a 3ath gate electrode GE3$a$, a 3ath active pattern ACT3$a$, a 3ath source electrode SE3$a$, and a 3ath drain electrode DE3$a$. The 3bth transistor T3$b$ may include a 3bth gate electrode GE3$b$, a 3bth active pattern ACT3$a$, a 3bth source electrode SE3$b$, and a 3bth drain electrode DE3$b$. Herein, the 3ath gate electrode GE3$a$ and the 3bth gate electrode GE3$b$ are referred to as a third gate electrode GE3, the 3ath active pattern ACT3$a$ and the 3bth active pattern ACT3$b$ are referred to as a third active pattern ACT3, the 3ath source electrode SE3$a$ and the 3bth source electrode SE3$b$ are referred to as the third source electrode SE3, and the 3ath drain electrode DE3$a$ and the 3bth drain electrode DE3$b$ are referred to as the third drain electrode DE3.

The third gate electrode GE3 may be connected to the upper ith first scan line S1$i$. The third gate electrode GE3 may be provided as a portion of the upper ith first scan line S1$i$ or may be provided in a shape protruding from the upper ith first scan line S1$i$. For example, the 3ath gate electrode GE3$a$ may be provided in a shape protruding from the upper ith first scan line S1$i$, and the 3bth gate electrode GE3$b$ may be provided as a portion of the upper ith first scan line S1$i$.

The third active pattern ACT3, the third source electrode SE3, and the third drain electrode DE3 may be formed of a semiconductor layer undoped or doped with impurities. For example, the third source electrode SE3 and the third drain electrode DE3 may be formed of a semiconductor layer doped with impurities, and the third active pattern ACT3 may be formed of a semiconductor layer undoped with impurities. The third active pattern ACT3 may correspond to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

In an embodiment, the fourth transistor T4 may be provided in a double gate structure so as to prevent or substantially prevent a leakage current. That is, the fourth transistor T4 may include a 4ath transistor T4$a$ and a 4bth transistor T4$b$. The 4ath transistor T4$a$ may include a 4ath gate electrode GE4$a$, a 4ath active pattern ACT4$a$, a 4ath source electrode SE4$a$, and a 4ath drain electrode DE4$a$, and the 4bth transistor T4$b$ may include a 4bth gate electrode GE4$b$, a 4bth active pattern ACT4$b$, a 4bth source electrode SE4$b$, and a 4bth drain electrode DE4$b$. Herein, the 4ath gate electrode GE4$a$ and the 4bth gate electrode GE4$b$ are referred to as a fourth gate electrode GE4, the 4ath active pattern ACT4$a$ and the 4bth active pattern ACT4$b$ are referred to as a fourth active pattern ACT4, the 4ath source electrode SE4$a$ and the 4bth source electrode SE4$b$ are referred to as a fourth source electrode SE4, and the 4ath drain electrode DE4$a$ and the 4bth drain electrode DE4$b$ are referred to as the fourth drain electrode DE4.

The fourth gate electrode GE4 may be connected to the (i−1)th first scan line S1$i$−1. The fourth gate electrode GE4 may be provided as a portion of the (i−1)th first scan line S1$i$−1 or may be provided in a shape protruding from the (i−1)th first scan line S1$i$−1. For example, the 4ath gate electrode GE4$a$ may be provided as a portion of the (i−1)th first scan line S1$i$−1. The 4bth gate electrode GE4$b$ may be provided in a shape protruding from the (i−1)th first scan line S1$i$−1.

The fourth active pattern ACT4, the fourth source electrode SE4, and the fourth drain electrode DE4 may be formed of a semiconductor layer undoped or doped with impurities. The fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 may correspond to a portion overlapping with the fourth gate electrode GE4.

One end of the fourth source electrode SE4 may be connected to the fourth active pattern ACT4. The other end of the fourth source electrode SE4 may be connected to a seventh drain electrode DE7 of a seventh transistor T7 of a pixel on a previous row. An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the previous row through an eighth contact hole CH8 on the previous row. One end of the fourth drain electrode DE4 may be connected to the fourth active pattern ACT4, and the other end of the fourth drain electrode DE4 may be connected to the third drain electrode DE3 of the third transistor T3. Also, the fourth drain electrode DE4 may be connected to the first gate electrode GE1 of the first transistor T1 through the connection line CNL, the second contact hole CH2, and first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first emission control line E1$i$. The fifth gate electrode GE5 may be provided as a portion of the first emission control line E1$i$ or may be provided in a shape protruding from the first emission control line E1$i$. The fifth active pattern ACT, the fifth source electrode SE5, and the fifth drain electrode DE5 may be formed of a semiconductor layer undoped or doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 may correspond to a portion overlapping with the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the first emission control line E1$i$. The sixth gate electrode SE6 may be provided as a portion of the first emission control line E1$i$ or may be provided in a shape protruding from the first emission control line E1$i$. The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 may correspond to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the lower ith first scan line S1$i$. The seventh gate electrode GE7 may be provided as a portion of the lower ith first scan line S1$i$ or may be provided in a shape protruding from the lower ith first scan line S1$i$. The seventh active pattern ACT7, the seventh source electrode SE7, and the seventh drain electrode DE7 may be formed of a semiconductor layer undoped or doped with impurities. For example, the seventh source electrode SE7 and the seventh drain electrode DE7 may be formed of a semiconductor layer doped with impurities, and the seventh active layer ACT7 may be formed of a semiconductor layer undoped with impurities. The seventh active pattern ACT7 may correspond to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a pixel on a subsequent row. The seventh drain electrode DE7 and the fourth source electrode SE4 of the fourth transistor T4 on the subsequent row may be connected to each other through the auxiliary connection line AUX, the eighth contact hole CH8, and the ninth contact hole CH9.

The storage capacitor Cst may include a lower electrode LE and an upper electrode UE. The lower electrode LE may be configured as the first gate electrode GE1 of the first transistor T1.

The upper electrode UE overlaps with the first gate electrode GE1, and may cover the lower electrode LE when viewed on a plane. As the overlapping area of the upper electrode UE and the lower electrode LE is widened, the capacitance of the storage capacitor Cst may be increased. The upper electrode UE may extend in the first direction DR. In an embodiment of the present disclosure, a voltage having the same level as that of the first power source may be applied to the upper electrode UE. The upper electrode UE may have an opening OPNG in a region including the first contact hole CH1 through which the first gate electrode GE1 and the connection line CNL are in contact with each other.

The light emitting device OLED may include a first electrode AD, a second electrode CD, and an emitting layer EML provided between the first electrode AD and the second electrode CD.

The first electrode AD may be provided in a light emitting region corresponding to each pixel unit PXL. The first electrode AD may be connected to the seventh source electrode SE7 of the seventh transistor T7 and the sixth drain electrode DE6 of the sixth transistor T6 through a seventh contact hole CH7 and a tenth contact hole CH10. A bridge pattern BRP may be provided between the seventh contact hole CH7 and the tenth contact hole CH10. The bridge pattern BRP may connect the first electrode AD to the sixth drain electrode DE6 and the seventh source electrode SE7.

Herein, a structure of the display device according to an embodiment of the present disclosure will be described along a stacking order with reference to FIGS. 7 to 9.

The active patterns ACT1 to ACT7 (hereinafter referred to as ACT) may be provided on the substrate SUB. The active patterns ACT may include the first to seventh active patterns ACT1 to ACT7. The first to seventh active patterns ACT1 to ACT7 may be formed of a semiconductor material.

A buffer layer BF may be provided between the substrate SUB and the first to seventh active patterns ACT1 to ACT7.

A first passivation layer PSV1 may be provided on the substrate SUB on which the first to seventh active patterns ACT1 to ACT7 are formed.

The (i−1)th first scan line S1$i$−1, the ith first scan line S1$i$, the emission control line E1$i$, and the first to seventh gate electrodes GE1 to GE7 may be provided on the first passivation layer PSV1. The first gate electrode GE1 may become the lower electrode LE of the storage capacitor Cst. The second gate electrode GE2 and the third gate electrode GE3 may be integrally formed with the ith first scan line S1$i$. The fourth gate electrode GE4 may be integrally formed with the (i−1)th first scan line S1$i$−1. The fifth gate electrode GE5 and the sixth gate electrode GE6 may be integrally formed with the emission control line E1$i$. The seventh gate electrode GE7 may be integrally formed with the ith first scan line S1$i$.

A second passivation layer PSV2 may be provided on the substrate SUB on which the (i−1)th first scan line S1$i$−1 and the like are formed.

The upper electrode UE of the storage capacitor Cst and the initialization power line IPL may be provided on the second passivation layer PSV2. The upper electrode UE may cover the lower electrode LE. The upper electrode UE along with the lower electrode LE may constitute the storage capacitor Cst with the second passivation layer PSV2 interposed therebetween.

A third passivation layer PSV3 may be provided on the substrate SUB on which the upper electrode UE and the like are formed.

The data line Dj, the connection line CNL, the auxiliary connection line AUX, and the bridge pattern BRP may be provided on the third passivation layer PSV3.

The data line Dj may be connected to the second source electrode SE2 through the sixth contact hole CH6 passing through the first to third passivation layers PSV1 to PSV3. The power line PL may be connected to the upper electrode UE of the storage capacitor Cst through the third and fourth contact holes CH3 and CH4 passing through the third passivation layer PSV3.

The power line PL may also be connected to the fifth source electrode SE5 through the fifth contact hole CH5 passing through the first to third passivation layers PSV1 to PSV3.

The connection line CNL may be connected to the first gate electrode GE1 through the first contact hole CH1 passing through the second passivation layer PSV2 and the third passivation layer PSV3. In addition, the other end of the connection line CNL may be connected to the third drain electrode DE3 and the fourth drain electrode DE4 through the second contact hole CH2 passing through the first to third passivation layers PSV1 to PSV3.

The auxiliary connection line AUX may be connected to the initialization power line IPL through the eighth contact hole CH8 passing through the third passivation layer PSV3. Also, the auxiliary connection line AUX may be connected to the fourth source electrode SE4 and a seventh drain electrode DE7 on a previous row through the ninth contact hole CH9 passing through the first to third passivation layers PSV1 to PSV3.

The bridge pattern BRP may be a pattern provided as a medium connecting the sixth drain electrode DE6 to the first electrode AD between the sixth drain electrode DE6 and the first electrode AD. The bridge pattern BRP may be connected to the sixth drain electrode DE6 and the first source electrode SE1 through the seventh contact hole CH7 passing through the first to third passivation layers PSV1 to PSV3.

A fourth passivation layer PSV4 and a first insulating layer INS1 may be provided on the substrate SUB on which the data line Dj and the like are formed.

The light emitting device OLED may be provided on the first insulating layer INS1. The light emitting device OLED may include the first electrode AD, the second electrode CD, and the emitting layer EML provided between the first electrode AD and the second electrode CD.

The first electrode AD may be provided on the first insulating layer INS1. The first electrode AD may be connected to the bridge pattern BRP through the tenth contact hole CH10 passing through the first insulating layer INS1. Since the bridge pattern BRP is connected to the sixth drain electrode DE6 and the seventh source electrode SE7 through the seventh contact hole CH7, the first electrode AD can be electrically connected to the sixth drain electrode DE6 and the seventh source electrode SE7.

A second insulating layer INS2 that defines a light emitting region to correspond to each pixel unit PXL may be provided on the substrate SUB on which the first electrode AD and the like are formed. The second insulating layer INS2 may expose an upper surface of the first electrode AD therethrough, and protrude from the substrate SUB along the circumference of the pixel unit PXL.

The emitting layer EML may be provided in the light emitting region surrounded by the second insulating layer INS2, and the second electrode CD may be provided on the emitting layer EML. An encapsulation layer SLM that covers the second electrode CD may be provided over the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the light emitting device OLED is a bottom-emission light emitting device, the first electrode AD may be a transmissive electrode, and the second electrode CD may be a reflective electrode. When the light emitting device OLED is a top-emission light emitting device, the first electrode AD may be a reflective electrode, and the second electrode CD may be a transmissive electrode. When the light emitting device OLED is a dual-emission light emitting device, both of the first electrode AD and the second electrode CD may be transmissive electrodes.

According to an aspect of the present disclosure, the display device is stable without separation of a component, even in a state in which the display device is bent.

Some example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
    a substrate including a display region and a bent region provided at a side of the display region;
    a first insulating layer provided on the bent region of the substrate;
    a second insulating layer provided on the first insulating layer, the second insulating layer including at least one opening;
    a third insulating layer provided on the second insulating layer and the at least one opening; and
    a plurality of lines electrically insulated from each other in the bent region,
    wherein a pixel unit to display an image is provided on the display region of the substrate,
    wherein the third insulating layer is in contact with the first insulating layer and the second insulating layer in the at least one opening, and
    wherein the at least one opening is provided between the plurality of lines.

2. The display device of claim 1, wherein the at least one opening is provided as a plurality of openings.

3. The display device of claim 1, wherein the second insulating layer includes a plurality of sub-insulating layers.

4. The display device of claim 2, wherein a diameter of an opening of the plurality of openings that is located at an inner region of the bent region is larger than a diameter of an opening of the plurality of openings that is located at an edge region of the bent region.

5. The display device of claim 1, wherein the first insulating layer includes a plurality of organic layers.

6. The display device of claim 1, wherein a depth of the at least one opening is smaller than a thickness of the third insulating layer.

7. The display device of claim 1, wherein the bent region of the substrate is foldable to have a radius of curvature of 5 mm or less.

8. The display device of claim 1, wherein a diameter of the at least one opening is about 0.5 μm to about 2 μm.

9. The display device of claim 1, wherein the at least one opening comprise openings provided in the form of a plurality of rows.

10. The display device of claim 1, wherein a distance from an upper surface of the second insulating layer to an upper surface of the third insulating layer is about 30 μm to about 150 μm.

11. The display device of claim 1, wherein the pixel unit includes a first electrode, an emitting layer, and a second electrode, which are sequentially stacked,
    wherein the second electrode is provided on the second insulating layer provided on the display region.

12. The display device of claim 11, further comprising an encapsulation layer provided over the second electrode,
    wherein the encapsulation layer is provided on the display region, and does not cover the bent region.

13. The display device of claim 1, wherein the at least one opening has a trapezoidal vertical cross-sectional shape such that a diameter of a region of the at least one opening that is closer to the first insulating layer is larger than a diameter of another region of the at least one opening that is farther from the first insulating layer.

14. A display device comprising:
    a substrate including a display region and a bent region provided at a side of the display region;
    a first insulating layer provided on the bent region of the substrate;
    a second insulating layer provided on the first insulating layer, the second insulating layer including at least one opening; and
    a third insulating layer provided on the second insulating layer and the at least one opening,
    wherein a pixel unit to display an image is provided on the display region of the substrate,
    wherein the second insulating layer includes a plurality of sub-insulating layers, and
    wherein sub-insulating layers of the plurality of sub-insulating layers include openings having diameters different from one another.

15. The display device of claim 14, wherein each of sub-insulating layers of the plurality of sub-insulating layers that are closer to the first insulating layer includes an opening having a larger diameter than openings of sub-insulating layers of the plurality of sub-insulating layers that are farther from the first insulating layer.

16. A display device comprising:
    a substrate including a display region and a bent region provided at a side of the display region;
    a first insulating layer provided on the bent region of the substrate;
    a second insulating layer provided on the first insulating layer, the second insulating layer including at least one opening; and
    a third insulating layer provided on the second insulating layer and the at least one opening,
    wherein a pixel unit to display an image is provided on the display region of the substrate, and
    wherein a thickness of the second insulating layer is about 5 μm to about 10 μm.

* * * * *